US009484300B2

(12) United States Patent
Ghosh et al.

(10) Patent No.: US 9,484,300 B2
(45) Date of Patent: Nov. 1, 2016

(54) DEVICE RESULTING FROM PRINTING MINIMUM WIDTH SEMICONDUCTOR FEATURES AT NON-MINIMUM PITCH

(71) Applicant: GLOBALFOUNDRIES Inc., Grand Cayman (KY)

(72) Inventors: Sonia Ghosh, Fishkill, NY (US); Randy Mann, Milton, NY (US); Norman Chen, Poughkeepsie, NY (US); Shaowen Gao, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/953,864

(22) Filed: Nov. 30, 2015

(65) Prior Publication Data

US 2016/0093565 A1 Mar. 31, 2016

Related U.S. Application Data

(62) Division of application No. 14/074,981, filed on Nov. 8, 2013, now Pat. No. 9,263,349.

(51) Int. Cl.

| | |
|---|---|
| ***H01L 21/00*** | (2006.01) |
| ***H01L 23/528*** | (2006.01) |
| ***H01L 21/66*** | (2006.01) |
| ***G06F 17/50*** | (2006.01) |
| ***H01L 21/3213*** | (2006.01) |
| ***H01L 23/522*** | (2006.01) |
| ***H01L 27/11*** | (2006.01) |
| *H01L 27/02* | (2006.01) |

(52) U.S. Cl.

CPC ......... *H01L 23/528* (2013.01); *G06F 17/5068* (2013.01); *H01L 21/32139* (2013.01); *H01L 22/12* (2013.01); *H01L 23/5226* (2013.01); *H01L 27/1116* (2013.01); *H01L 27/0207* (2013.01); *H01L 2924/0002* (2013.01); *Y02T 10/82* (2013.01)

(58) Field of Classification Search

CPC ... H01L 21/308; H01L 23/481; H01L 27/12; H01L 21/8238

USPC ........................................................... 438/30

See application file for complete search history.

(56) References Cited

U.S. PATENT DOCUMENTS

| | | | | |
|---|---|---|---|---|
| 6,459,113 B1 * | 10/2002 | Morihara | .......... H01L 27/10805 257/296 |
| 7,220,634 B2 * | 5/2007 | Prall | .................. G11C 11/5692 257/E27.091 |
| 7,585,742 B2 * | 9/2009 | Koyama | ............... H01L 27/115 257/E23.179 |
| 8,058,137 B1 * | 11/2011 | Or-Bach | ............. H03K 17/687 257/E21.023 |
| 8,415,089 B1 * | 4/2013 | Gupta | ................. G03F 7/70466 430/311 |

(Continued)

*Primary Examiner* — Caleb Henry

(74) *Attorney, Agent, or Firm* — Ditthavong & Steiner, P.C.

(57) ABSTRACT

Methods for forming a semiconductor layer, such as a metal1 layer, having minimum width features separated by a distance greater than a minimum pitch, and the resulting devices are disclosed. Embodiments may include determining a first shape and a second shape having a minimum width within a semiconductor layer, wherein a distance between the first shape and the second shape is greater than a minimum pitch, determining an intervening shape between the first shape and the second shape, and designating a dummy shape within the intervening shape, wherein the dummy shape is at the minimum pitch from the first shape.

7 Claims, 7 Drawing Sheets

(56) References Cited

U.S. PATENT DOCUMENTS 8,575,760 B2 * 11/2013 Phee ................. H01L 21/76898 257/621
8,673,782 B2 * 3/2014 Park ....................... G11C 5/063 438/689
8,739,083 B1 * 5/2014 Tung ................... G06F 17/5081 430/30
8,969,965 B2 * 3/2015 Chang ............... H01L 29/66545 257/347
9,009,641 B2 * 4/2015 Becker .................. H01L 27/092 716/118
2002/0034855 A1 * 3/2002 Horiguchi ............. H01L 27/108 438/298
2003/0198872 A1 * 10/2003 Yamazoe ................ G03F 1/144 430/5
2004/0021139 A1 * 2/2004 Jackson ............ H01L 21/76898 257/40
2004/0043618 A1 * 3/2004 Hellig ............... H01L 21/31116 438/694
2007/0004117 A1 * 1/2007 Yagishita .............. H01L 21/845 438/197
2008/0036042 A1 * 2/2008 Sano ....................... H01L 21/78 257/620
2008/0128924 A1 * 6/2008 Liu ..................... G03F 7/70625 257/797
2008/0160422 A1 * 7/2008 Chen ......................... G03F 1/29 430/5
2008/0179679 A1 * 7/2008 Grudowski ....... H01L 21/31105 257/351
2009/0130852 A1 * 5/2009 Kewley ............... H01L 21/0337 438/694
2009/0273100 A1 * 11/2009 Aton ................. H01L 21/31144 257/786
2010/0009554 A1 * 1/2010 Ryu .................... H01L 21/4846 439/65
2011/0057315 A1 * 3/2011 Fang ................. H01L 21/76816 257/750
2011/0102011 A1 * 5/2011 Van der Plas . G01R 31/318513 324/762.03
2011/0113393 A1 * 5/2011 Sezginer ............. G06F 17/5077 716/106
2011/0215479 A1 * 9/2011 Schulz .................. H01L 21/027 257/773
2011/0241207 A1 * 10/2011 Kuo .................... G06F 17/5068 257/741
2011/0281220 A1 * 11/2011 Matsuda ............. H01L 21/0273 430/325
2012/0007214 A1 * 1/2012 Chu .................... H01L 23/5223 257/532
2012/0018807 A1 * 1/2012 Tsuchiya ................. H01L 21/84 257/347
2012/0032273 A1 * 2/2012 Suzuki ............ H01L 21/823814 257/369
2012/0043630 A1 * 2/2012 Omori ................... H01L 27/228 257/421
2012/0094492 A1 * 4/2012 Park .................... H01L 21/0337 438/694
2012/0273955 A1 * 11/2012 Or-Bach ............... G03F 9/7076 257/762
2012/0299106 A1 * 11/2012 Mann ............. H01L 21/823821 257/351
2012/0313256 A1 * 12/2012 Lu ..................... H01L 21/31144 257/774
2013/0020707 A1 * 1/2013 Or-Bach ................ B82Y 10/00 257/741
2013/0122672 A1 * 5/2013 Or-Bach ........... H01L 29/78696 438/199
2013/0236836 A1 * 9/2013 Sun ........................... G03F 7/70 430/322
2013/0242645 A1 * 9/2013 Calhoun ............... G11C 11/412 365/154
2014/0003133 A1 * 1/2014 Lin ....................... G11C 11/419 365/154
2014/0162460 A1 * 6/2014 Lee ..................... H01L 21/3086 438/703
2014/0235055 A1 * 8/2014 Mehta ................... H01L 21/308 438/694
2014/0264961 A1 * 9/2014 Huang ................ G03F 7/70633 257/797
2014/0282344 A1 * 9/2014 Hsu ..................... G06F 17/5072 716/123
2015/0064916 A1 * 3/2015 Shieh ................ H01L 29/66795 438/702
2015/0084129 A1 * 3/2015 Lee ..................... H01L 29/6681 257/347
2015/0130026 A1 * 5/2015 Ghosh ..................... H01L 22/12 257/618

* cited by examiner 101
103
101
103
103
101
103
101
103
101
103
100
101
103
101
103

DEVICE RESULTING FROM PRINTING MINIMUM WIDTH SEMICONDUCTOR FEATURES AT NON-MINIMUM PITCH

RELATED APPLICATION

The present application is a Divisional application of application Ser. No. 14/074,981, filed on Nov. 8, 2003, which is incorporated herein by reference in its entirety.

TECHNICAL FIELD

The present disclosure relates to printing minimum width features. The present disclosure is particularly applicable to printing minimum width features at non-minimum width pitch and is particularly applicable to 20 nanometer (nm) technology nodes and beyond.

BACKGROUND

Semiconductor layers may undergo a process of retargeting to ensure printability and manufacturability, particularly for 20 nm nodes and smaller. Retargeting involves the process of taking design shapes provided by semiconductor designers and turning the shapes into target shapes after tape-out. As a result of retargeting, it is not possible to attain minimum metal width for non-minimum pitch metals. The inability to obtain minimum metal width for non-minimum metal pitch metals poses particular problems. Certain semiconductor designs may require narrower widths or more spacing than what retargeting allows, to satisfy design constraints.

A need therefore exists for the ability to print minimum width semiconductor design features at non-minimum pitch, and resulting devices.

SUMMARY

An aspect of the present disclosure is a method of forming a semiconductor layer having minimum width features separated by a distance greater than a minimum pitch.

Another aspect of the present disclosure is a semiconductor device having a layer with minimum width features separated by a distance greater than a minimum pitch.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including determining a first shape and a second shape having a minimum width within a semiconductor layer, where a distance between the first shape and the second shape is greater than a minimum pitch, determining an intervening shape between the first shape and the second shape, and designating a dummy shape within the intervening shape, where the dummy shape is at the minimum pitch from the first shape.

An aspect of the present disclosure includes designating a second dummy shape within the intervening shape, where the second dummy shape is at the minimum pitch from the second shape. Another aspect includes the dummy shape being at the minimum pitch from the second shape. Yet another aspect includes the dummy shape having the minimum width. A further aspect includes patterning a first hardmask according to the first shape, the second shape and the dummy shape during a first lithography-etch step in forming the semiconductor layer. Still another aspect includes patterning a second hardmask according to the intervening shape during a second lithography-etch step in forming the semiconductor layer. A further aspect includes at least part of the patterned first hardmask and the patterned second hardmask overlapping according to the dummy shape. An additional aspect includes the semiconductor layer being a metal1 (M1) layer.

Another aspect of the present disclosure is a device including: a semiconductor layer including: a first shape and a second shape having a minimum width, where a distance between the first shape and the second shape is greater than a minimum pitch, and an intervening shape between the first shape and the second shape.

Aspects include the semiconductor layer being an M1 layer. Further aspects include a portion of the intervening shape including a dummy shape, where the dummy shape is at the minimum pitch from the first shape. Another aspect includes the dummy shape having the minimum width. Further aspects include a second portion of the intervening shape including a second dummy shape, where the second dummy shape is at the minimum pitch from the second shape. Yet another aspect includes the semiconductor layer formed by patterning a first hardmask according to the first shape, the second shape and the dummy shape during a first lithography-etch step. Still another aspect includes the semiconductor layer formed by patterning a second hardmask according to the intervening shape during a second lithography-etch step. Another aspect includes at least part of the patterned first hardmask and the patterned second hardmask overlapping according to the dummy shape in forming the semiconductor layer.

Another aspect of the present disclosure is a method including determining a first shape having a minimum width that is greater than a minimum pitch from a second shape having the minimum width, and designating a dummy shape in an intervening shape between the first shape and the second shape, where the dummy shape is at the minimum pitch from the first shape and the second shape and is at least the minimum width.

Additional aspects include the dummy shape including a first portion and a second portion, the first portion being at the minimum pitch from the first shape and the second portion being at the minimum pitch from the second shape. Yet another aspect includes the first portion and the second portion each having the minimum width. Further aspects include patterning a first hardmask according to the first shape, the second shape and the dummy shape during a first lithography-etch step in forming the semiconductor layer, and patterning a second hardmask according to the intervening shape during a second lithography-etch step in forming the semiconductor layer, where at least part of the patterned first hardmask and the patterned second hardmask overlap according to the dummy shape Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current inability to form minimum width features separated by distances greater than a minimum pitch attendant upon retargeting, particularly associated with litho-etch, litho-etch (LELE) processing for forming metal layers in semiconductor devices of 20 nm technology nodes and beyond. In accordance with embodiments of the present disclosure, dummy shapes at a minimum pitch from the minimum width features are designated in intervening shapes between the minimum width features.

Methodology in accordance with an embodiment of the present disclosure includes determining a first shape and a second shape having a minimum width within a semiconductor layer, such as a M1 layer, with the distance between the first shape and the second shape being greater than a minimum pitch. Next, an intervening shape is determined between the first shape and the second shape. At least one dummy shape is designated within the intervening shape with the at least one dummy shape being a minimum pitch from one or more of the first shape and the second shape. During patterning and formation of the minimum width features, the dummy shape is also patterned and formed, such as during the same litho-etch step in a LELE process, thereby avoiding the requirement of retargeting while achieving design constraints requiring minimum width features separated by greater than a minimum pitch.

Figure 1:
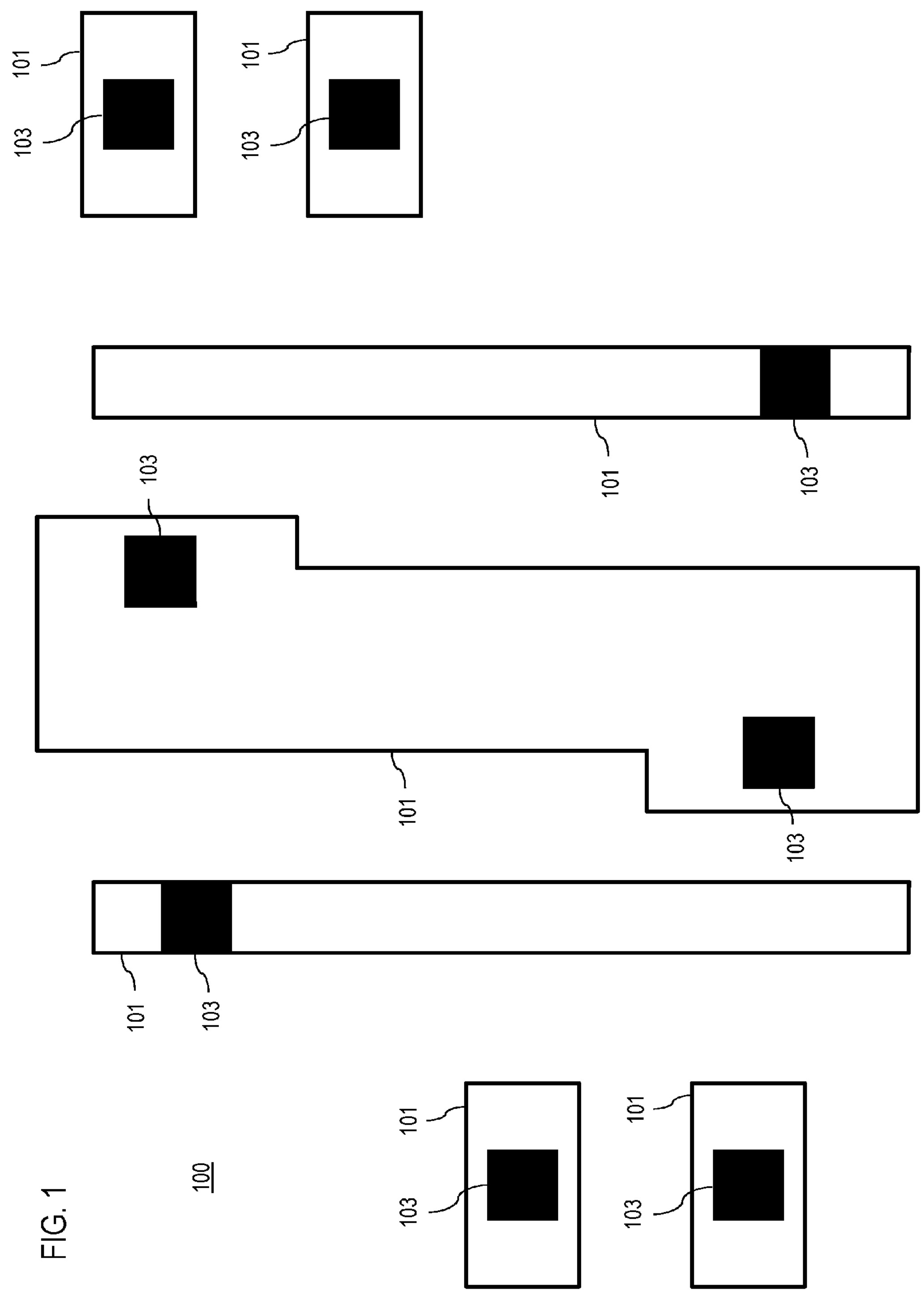
FIGS. 1 and 2 are schematic diagrams of a layout of a semiconductor layer, in accordance with an exemplary embodiment.
Figure 2:
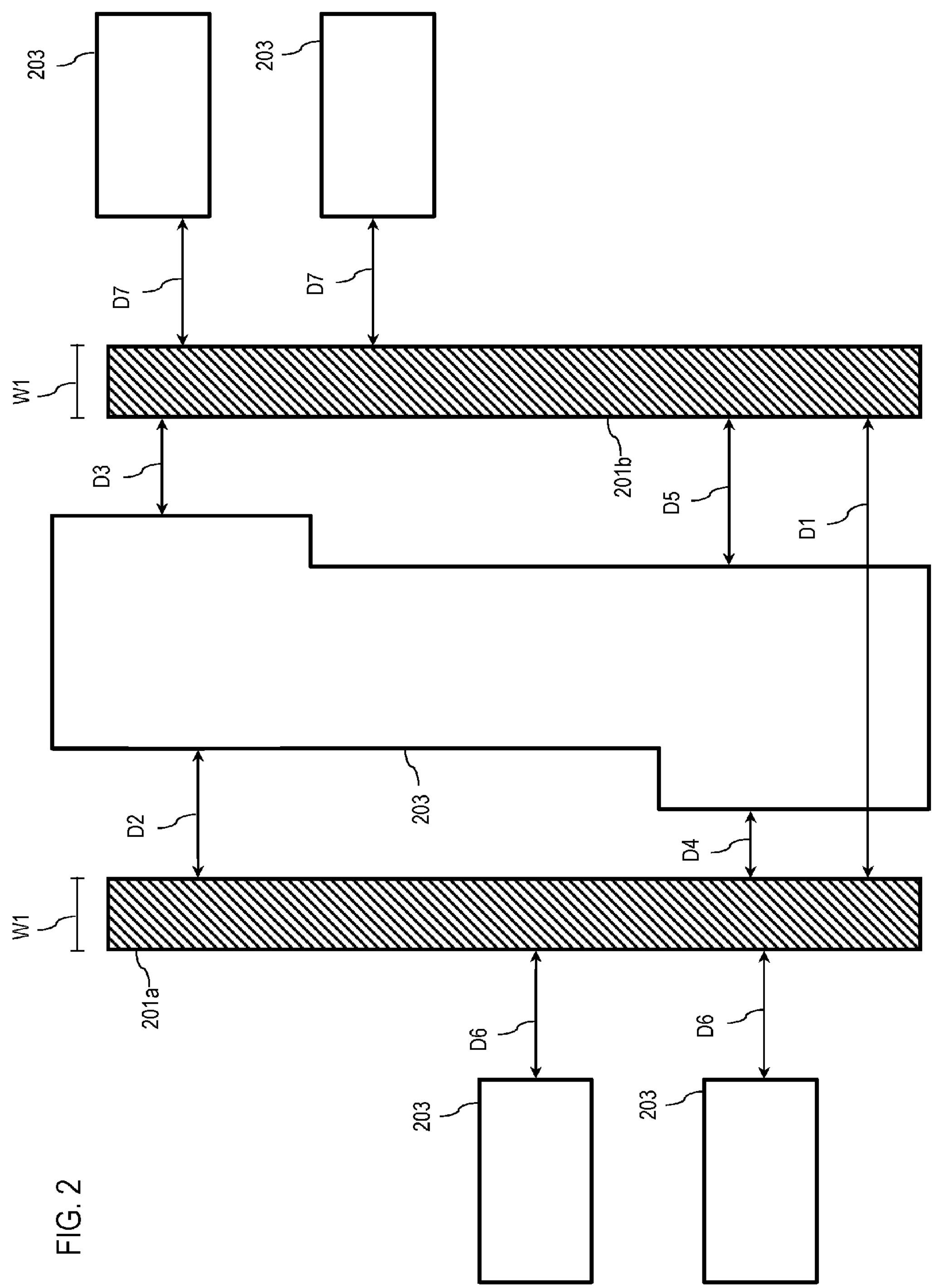

Adverting to FIG. 1, a bitcell layout 100 for a semiconductor design, such as for a static-random access memory (SRAM) cell, may include a metal layer 101 (e.g., M1 layer) and a vertical interconnect access (VIA) layer 103 (e.g., V0 layer). Although described as a single metal layer 101, because of limits in semiconductor manufacturing, the metal layer 101 may be formed using multiple lithography-etch steps, such as LELE. Thus, FIG. 2 illustrates the metal layer 101 divided into two litho-etch steps. A first litho-etch step may include forming shapes 201*a* and 201*b* and a second litho-etch step may include forming shapes 203. Although described as first and second litho-etch steps, the order of the steps may be switched. Shapes 201*a* and 201*b* may correspond to bitlines and may have minimum width W1, such as 32 nm. Although illustrated as line segments, shapes 201*a* and 201*b* may continue above and below the illustration in FIG. 2 as continuous bitlines. Shape 203 may correspond to various contacts for the VIAs in the VIA layer 103. Shapes 201*a*, 201*b*, and 203 may be separated by distances D2 through D7, as illustrated. However, shape 201*a* may be separated a distance D1 from feature 201*b*. The distance D1 may be greater than a minimum pitch, such as the distance D1 being 256 nm and the minimum pitch being 128 nm for a shape with a minimum width of 32 nm. Although described as a M1 layer, the metal layer 101 may be any layer, such as any metal layer (e.g., M1-$M_n$) or other non-metal layer that may include shapes of a minimum width that are separated by a distance greater than a minimum pitch.

Figure 3:
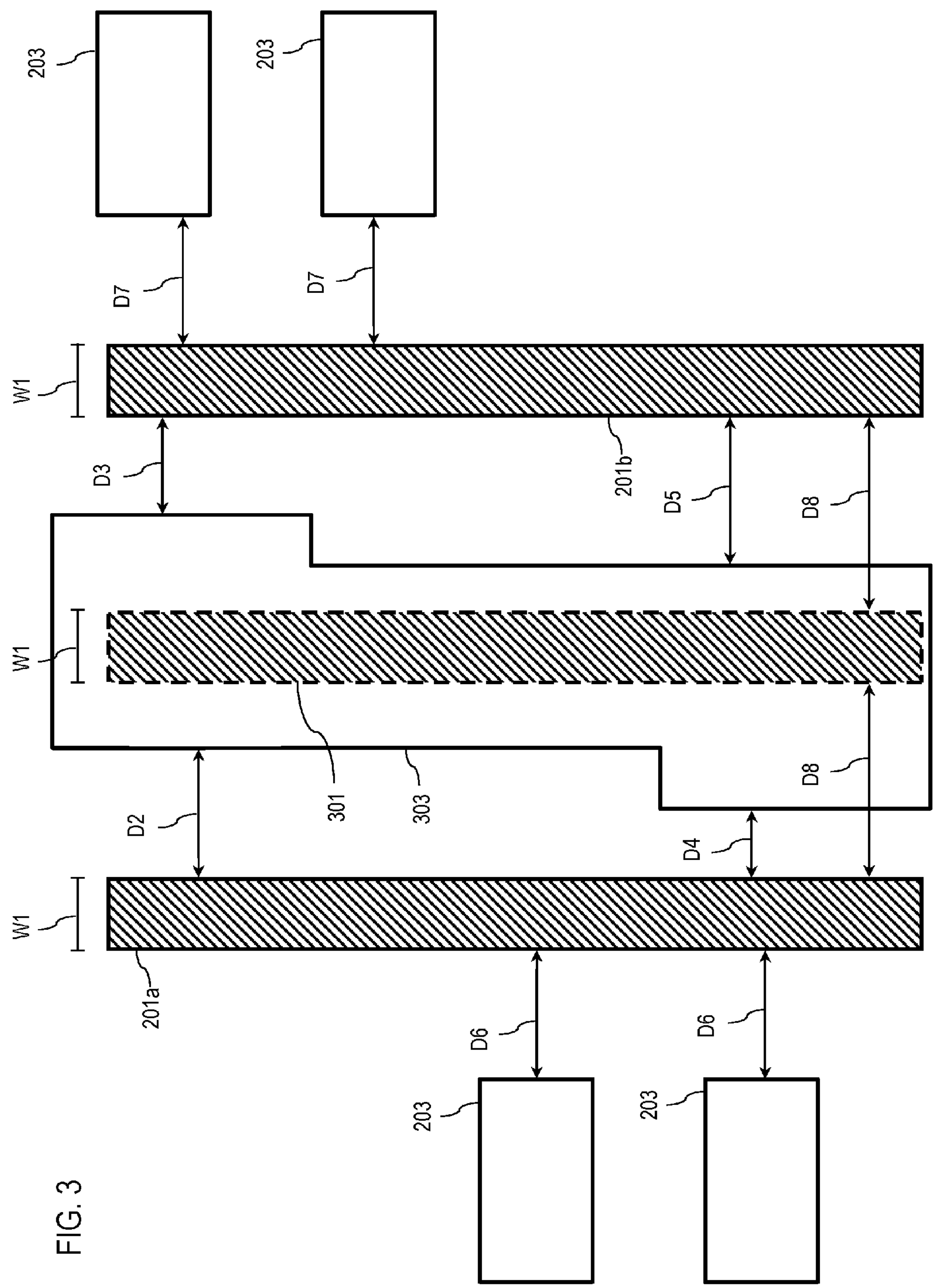
FIGS. 3 through 5 are schematic diagrams of layouts of a semiconductor layer including one or more dummy shapes in an intervening shape, in accordance with exemplary embodiments.

Shape 203 may include intervening shape 303 that is between shapes 201*a* and 201*b*, as illustrated in FIG. 3. Based on the presence of intervening shape 303 between shapes 201*a* and 201*b*, a dummy shape 301 may be designated within the intervening shape 303. The dummy shape 301 may be associated with the litho-etch step associated with shapes 201*a* and 201*b*, as indicated by the similar fill pattern in FIG. 3. As illustrated, the dummy shape 301 may be fully contained within the intervening shape 303. Further, the dummy shape 301 may be a distance D8 from shapes 201*a* and 201*b*. The distance D8 may be the minimum pitch such that shapes 201*a* and 201*b* are a minimum pitch from the dummy shape 301. Further, the dummy shape 301 may have the minimum width W1 as shapes 201*a* and 201*b* (e.g., 32 nm), or may have a width narrower than the minimum width W1. Thus, during patterning and formation of shapes 201*a* and 201*b* for the metal layer 101 (e.g., M1 layer) in a litho-etch step, the dummy shape 301 may be patterned and formed along with shapes 201*a* and 201*b*. Because the intervening shape 303 is formed during a subsequent (or previous) litho-etch step in forming the metal layer 101 that fully contains the dummy shape 301, the presence of the dummy shape 301 does not affect formation of the ultimate bitcell layer. Rather, patterning and etch for dummy shape 301 will merely partially correspond to the patterning and etch for the intervening shape 303. Designating dummy shape 301 within the intervening shape 303 allows for forming shapes 201*a* and 201*b* having minimum widths but still separated by greater than a minimum pitch from each other and alleviates any need for retargeting.

FIG. 3 illustrates an example where the minimum width of shapes 201*a* and 201*b* combined with the minimum pitch D8 and distance D1 allows for one dummy shape 301 of the minimum width fully contained within the intervening shape 303 and at the minimum pitch from both shapes 201*a* and 201*b*. However, depending on specific values for the minimum width, minimum pitch and distance between minimum width shapes, more than one dummy shape having a minimum width may be formed within the intervening shape 303.

Figure 4:
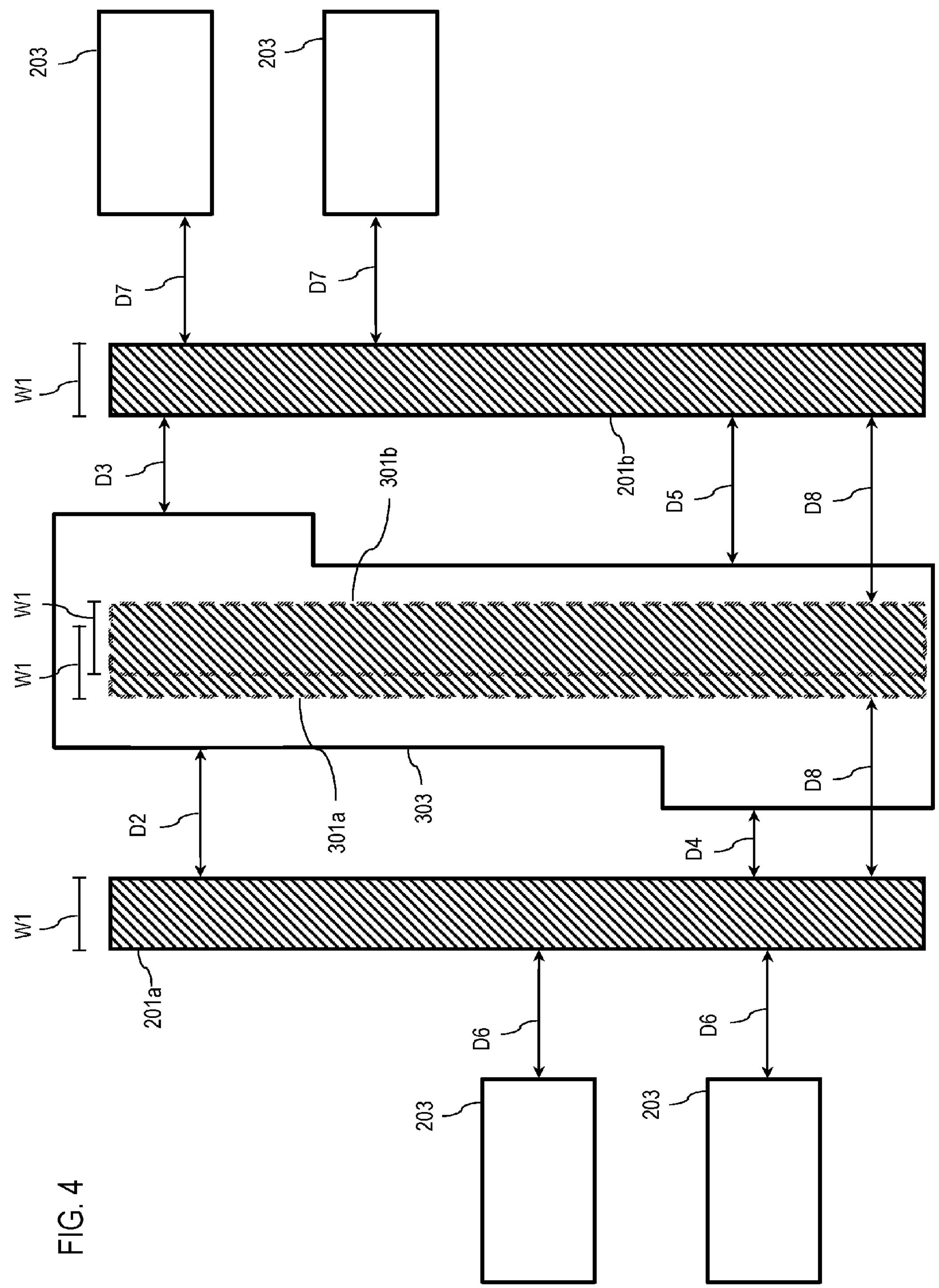

FIG. 4 illustrates two dummy shapes 301*a* and 301*b* within intervening shape 303. Both dummy shapes 301*a* and 301*b* may be formed having the minimum width W1, with dummy shape 301*a* at a minimum pitch D8 from shape 201*a* and dummy shape 301*b* at a minimum pitch D8 from shape 201*b*. Thus, dummy shape 301 may be composed of multiple dummy shapes (e.g., 301*a* and 301*b*) or portions with each portion having a minimum width (e.g., W1) and being a minimum pitch (e.g., D8) from a non-dummy shape having a minimum width (e.g., shapes 201*a* and 201*b*). Further, dummy shapes 301*a* and 301*b* may be formed during the same litho-etch step as shapes 201*a* and 201*b*, as indicated by the similar fill pattern illustrated in FIG. 4.

Figure 5:
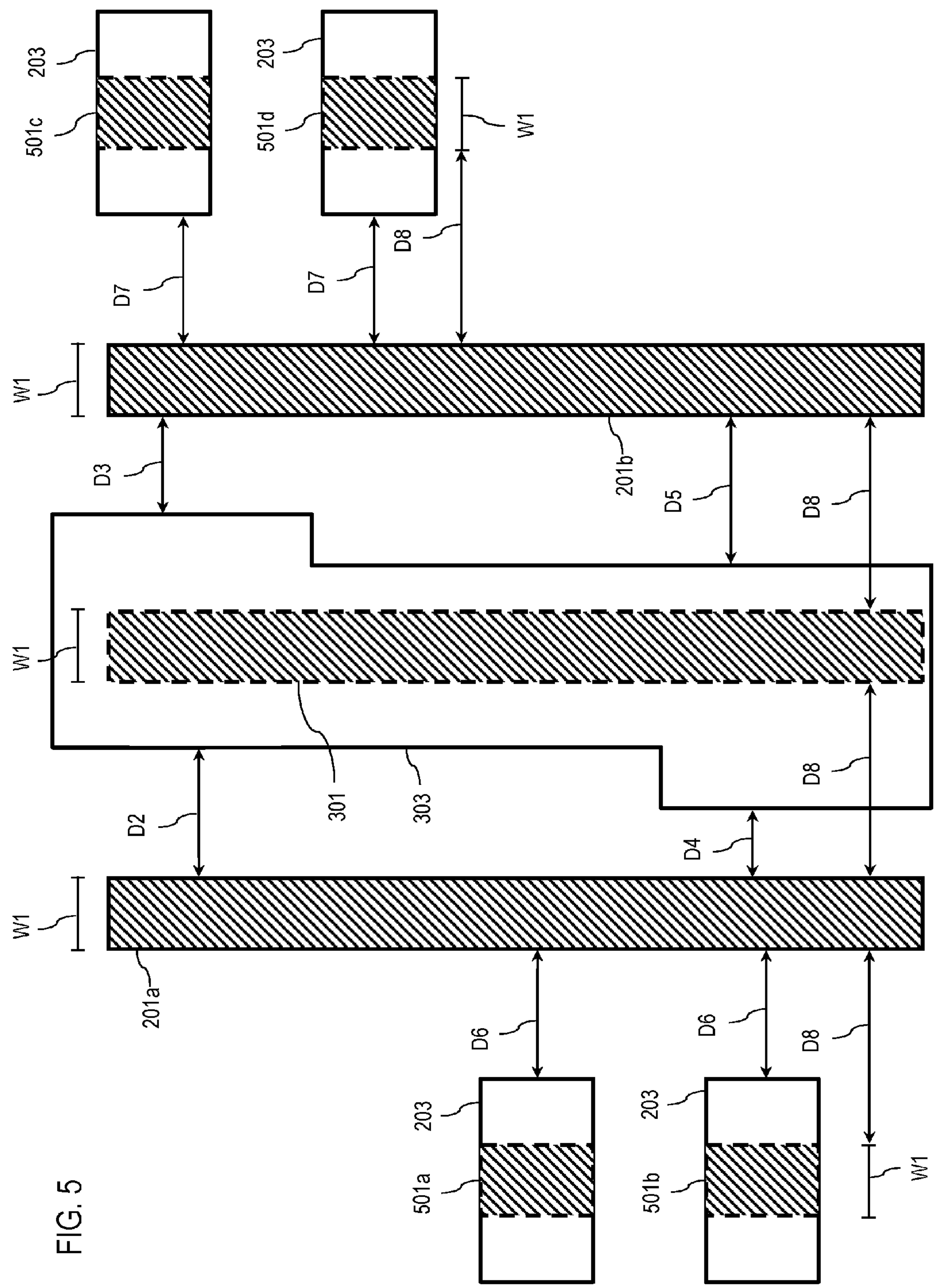

Although illustrated between shapes 201*a* and 201*b*, dummy shapes may also be designated in other portions of shape 203 that are not between shapes 201*a* and 201*b*, in addition to being designated in intervening shape 303. FIG. 5 illustrates that dummy shapes 501*a* and 501*b* may be designated within shape 203 to the left of shape 201*a* and dummy shapes 501*c* and 501*d* may be designated within shape 203 to the right of shape 201*b*. Dummy shapes 501*a* through 501*d* may correspond to virtual bitlines that intervene with the portions of shape 203 on either side of shapes 201*a* and 201*b*. As further illustrated, dummy shapes 501*a* through 501*d* have the minimum width W1. Further, dummy shapes 501*a* and 501*b* are separated from shape 201*a* by the minimum pitch D8, and dummy shapes 501*c* and 501*d* are separated from shape 201*b* by the minimum pitch D8. Further, dummy shapes 501*a* through 501*d* may be formed during the same litho-etch step as shapes 201*a* and 201*b*, as indicated by the similar fill pattern illustrated in FIG. 5.

Figure 6:
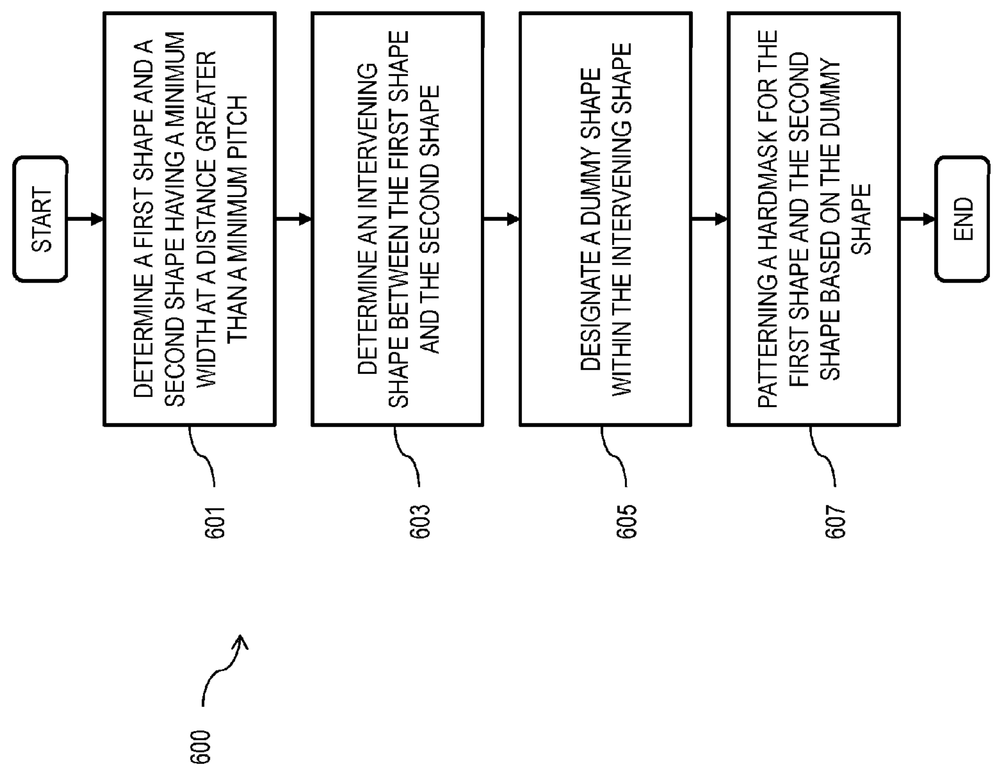
FIG. 6 is a flowchart of a process for forming a semiconductor layer using one or more dummy shapes in an intervening shape, in accordance with an exemplary embodiment.

FIG. 6 is a flowchart of a process 600 forming a semiconductor layer using one or more dummy shapes in an intervening shape, according to an exemplary embodiment. At step 601, a first shape and a second shape are determined that have a minimum width within a semiconductor layer, where a distance between the first shape and the second shape is greater than a minimum pitch. As discussed above, a first shape and a second shape may have a width of 32 nm, which may be a minimum width, and the first shape may be separated from the second shape by more than a minimum pitch, such as 128 nm.

At step 603, an intervening shape is determined between the first shape and the second shape. The intervening shape may be less than or equal to a minimum pitch from the first shape and the second shape.

At step 605, a dummy shape is designated within the intervening shape. The dummy shape is designated such that it is a minimum pitch from at least one of the first shape and the second shape. The dummy shape may also be the minimum pitch from each of the first shape and the second shape. Alternatively, more than one dummy shape may be designated within the intervening shape, such that one dummy shape is a minimum pitch from the first shape and another dummy shape is a minimum pitch from the second shape. Further, the dummy shape (or shapes) is designated to have the minimum width as the first shape and the second shape.

At step 607, a first hardmask is patterned according to the first shape, the second shape, and the dummy shape (or shapes) during a litho-etch step in forming a semiconductor layer, such as in a first or second litho-etch step in a LELE process. A second hardmask is also patterned according to the intervening shape during another litho-etch step in forming the semiconductor layer. Because the dummy shape is fully contained within the intervening shape, at least part of the patterned first hardmask and the patterned second hardmask overlap according to the second dummy shape. Accordingly, a semiconductor layer may be formed (e.g., M1 layer) that has minimum width features separated by a distance of greater than a minimum pitch without the need for retargeting.

Figure 7:
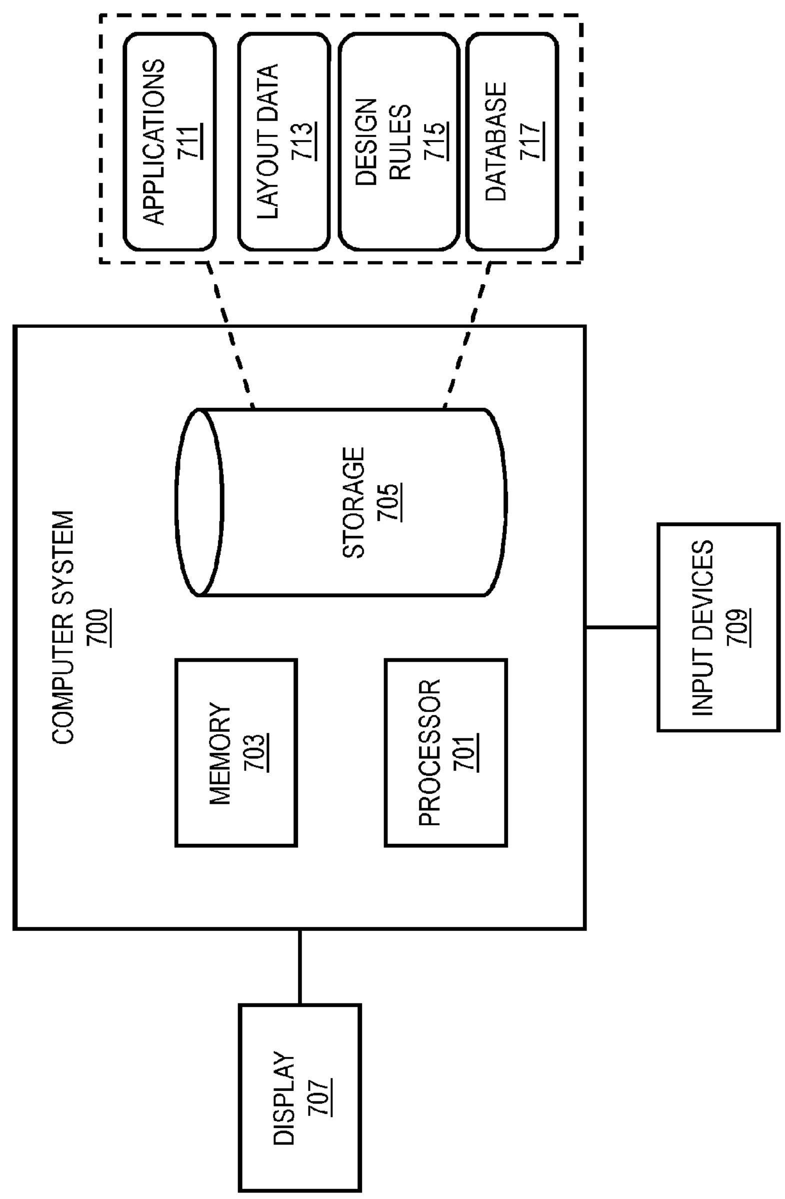
FIG. 7 schematically illustrates a computer system for implementing the process of FIG. 6, according to an exemplary embodiment.

The processes described herein may be implemented via software, hardware, firmware, or a combination thereof. Exemplary hardware (e.g., computing hardware) is schematically illustrated in FIG. 7. As shown, computer system 700 includes at least one processor 701, at least one memory 703, and at least one storage 705. Computer system 700 may be coupled to display 707 and one or more input devices 709, such as a keyboard and a pointing device. Display 707 may be utilized to provide one or more GUI interfaces. Input devices 709 may be utilized by users of computer system 700 to interact with, for instance, the GUI interfaces. Storage 705 may store applications 711, layout data (or information) 713, design plus rules 715, and at least one shape database (or repository) 717. Applications 711 may include instructions (or computer program code) that when executed by processor 701 cause computer system 700 to perform one or more processes, such as one or more of the processes described herein. In exemplary embodiments, applications 711 may include one or more manufacturability analysis and/or yield enhancement tools.

The embodiments of the present disclosure achieve several technical effects, including minimum width features, such as in an M1 layer, separated at greater than a minimum pitch while maintaining specific design constraints without the need for retargeting. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for 20 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. An apparatus comprising:

a semiconductor layer comprising a dummy shape, a first shape and a second shape, wherein the first shape has a minimum width within the semiconductor layer that is greater than a minimum pitch from the second shape having the minimum width, the dummy shape is provided in an intervening shape between the first shape and the second shape, and the dummy shape is at the minimum pitch from the first shape and the second shape and is at least the minimum width.

2. The apparatus according to claim 1, wherein the dummy shape comprises a first portion and a second portion, the first portion being at the minimum pitch from the first shape and the second portion being at the minimum pitch from the second shape.

3. The apparatus according to claim 1, wherein the semiconductor layer is a metal1 (M1) layer.

4. The apparatus according to claim 1, wherein the semiconductor layer is formed by patterning a first hardmask according to the first shape, the second shape and the dummy shape during a first lithography-etch step.

5. The apparatus according to claim 4, wherein the semiconductor layer is formed by patterning a second hardmask according to the intervening shape during a second lithography-etch step.

6. The apparatus according to claim 1, the minimum width is 32 nm.

7. The apparatus according to claim 1, the minimum pitch is 128 nm.

* * * * *